(12) United States Patent
Ganzelmi et al.

(10) Patent No.: US 6,230,308 B1
(45) Date of Patent: May 8, 2001

(54) METHOD OF ASSEMBLING MODULES TO FORM A COMPLEX INTEGRATED CIRCUIT AND CORRESPONDING MODULE ARCHITECTURE

(75) Inventors: Roberto Ganzelmi, Vittuone; Cesare Pozzi, Capriate; Alberto Battaia, Ispra, all of (IT)

(73) Assignee: SGS-Thomson Microelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/046,216

(22) Filed: Mar. 23, 1998

(30) Foreign Application Priority Data

Mar. 28, 1997 (IT) ................................ MI97A0744

(51) Int. Cl.[7] ............................. G06F 17/50; H03K 19/00
(52) U.S. Cl. .................................... 716/17; 716/8
(58) Field of Search .................... 716/1, 2, 3, 7, 716/17, 8

(56) References Cited

U.S. PATENT DOCUMENTS 4,926,376 * 5/1990 Rosini ................................ 716/8
5,870,310 * 2/1999 Malladi ............................ 364/490
5,915,103 * 6/1999 Chambers et al. .................. 395/306

OTHER PUBLICATIONS

Lamore et al., "Layout Placement of Sliced Architecture," IEEE Transactions on Computer–Aided Design, vol. 11, No. 1 Jan. 1992, pp. 102–114.*

Paik et al., "Optimal Folding of Bit Sliced Stacks," IEEE Transactions on Computer–Aided Design of Integrated Circuits and Systems, vol. 12, No. 11, Nov. 1993, pp. 1679–1685.*

* cited by examiner

Primary Examiner—Matthew Smith
Assistant Examiner—Leigh Marie Garbowski
(74) Attorney, Agent, or Firm—Theodore E. Galanthay; Allen, Dyer, Doppelt, Milbrath & Gilchrist, P.A.

(57) ABSTRACT

The method relates to assembling modules for an integrated circuit comprising at least a plurality of modules. The method provides for the formation of at least one module architecture which comprises a plurality of modules and is aligned along one dimension of such modules. The invention also concerns an integrated circuit and a stacked module architecture obtained with the inventive assembling method.

20 Claims, 3 Drawing Sheets

METHOD OF ASSEMBLING MODULES TO FORM A COMPLEX INTEGRATED CIRCUIT AND CORRESPONDING MODULE ARCHITECTURE

FIELD OF THE INVENTION

This invention relates to a method of assembling modules to form a complex integrated circuit. The invention also relates to an integrated circuit and a module architecture of the stack type. The invention relates in particular, but not exclusively, to a method of assembling modules to form an integrated circuit, and the description which follows makes reference to this field of application for convenience of illustration.

BACKGROUND OF THE INVENTION

High-complexity integrated circuits, such as a microprocessor integrated in a single chip, for example, are known to include a plurality of sub-circuits, commonly termed modules, which are interfaced by suitable electrical connections carrying system signals. These signals may either be data or control signals which are transmitted under management by a supervisory module, such as a CPU.

Each of the modules included in a single integrated circuit is intended to implement a specific function. For example, certain modules may function as analog-to-digital converters, or serial circuits, or logic units, etc. An individual module contains an interface circuit enabling it to communicate with other modules.

FIG. 1 shows schematically a portion of a final integrated circuit CIF comprising four modules and being assembled in a conventional manner. In this example, the final integrated circuit CIF portion comprises first 1, second 2, third 3 and fourth 4 modules, respectively designated LOGICA_1, LOGICA_2, LOGICA_3 and LOGICA_4. These four modules have first IF1, second IF2, third IF3 and fourth IF4 interface circuits, respectively, which are respectively designated INTERFACCIA_1, INTERFACCIA_2, INTERFACCIA_3 and INTERFACCIA_4.

It should be noted that the modules in an integrated circuit may come in two general categories: simple modules, which are characterized by having a small number of transistors and a simple interface circuit (the modules 2, 3 and 4 in the example of FIG. 1); and complex modules, which are characterized by having a large number of transistors and either a simple or complex interface circuit (such as module 1 in the example of FIG. 1).

When formed on a semiconductor, the layout of each of these modules, whether simple or complex, is usually given an aspect ratio, or length-to-width layout ratio, aimed at producing the densest possible integrated circuit. The different modules are then assembled, either manually or automatically, into the final integrated circuit CIF portion.

The schematic presentation of FIG. 1 brings to light some limitations of this conventional assembly method, as specified below.

1. A high silicon area requirement, for interfacing the individual modules. The final integrated circuit CIF portion of FIG. 1 includes a number of interface circuits equal to the number of modules, and a complicated pattern of buses 5 must be provided for supplying these interface circuits IF1, IF2, IF3 and IF4.

2. An intensification of the capacitance driven from a common system bus 8, connected to the complicated pattern of buses 5 and to additional connection buses 6 and 7, resulting in the speed of the final integrated circuit CIF portion being slowed.

3. More complicated assembling of the individual modules 1, 2, 3 and 4, resulting in lengthened times for developing the final integrated circuit CIF.

An alternative approach would be to make all modules, both simple and complex, with the same length, so as to simplify the assembling procedure. However, even this alternative approach has a serious drawback. In fact, the modules it produces would not be individually optimized, while a large area would be occupied by internal connections commonly known as the connection paths.

SUMMARY OF THE INVENTION

In view of the foregoing background, it is therefore an object of the present invention to provide a method of assembling modules into an integrated circuit, which has such structural and functional features as to overcome the limitations of prior assembling methods, especially with regard to the silicon area requirement.

The present invention is directed to creating module architectures aligned along one dimension, specifically architectures of simple modules having an individually optimized aspect ratio to produce a dense final integrated circuit, having the same width along a direction X, and being aligned in their length direction. Thus, a more efficient aspect ratio is obtained in the respect of both the individual simple modules and the final integrated circuit.

The present invention is also directed to a method as previously indicated of assembling modules to form a complex integrated circuit including a plurality of such modules, which method is characterized in that it provides a module architecture which is aligned along one dimension of the modules. The integrated circuit, comprising at least a plurality of modules, preferably comprises at least one portion constructed as a module architecture aligned along one dimension of the modules.

The module architecture, comprising a plurality of modules and being adapted for introduction into a complex integrated circuit, is characterized by the plurality of modules being aligned along one module dimension. The module architecture is further characterized in that it comprises a common interface circuit combining all the characteristics of individual interface circuits of the individual modules.

BRIEF DESCRIPTION OF THE DRAWINGS

The features and advantages of the method, integrated circuit, and module architecture according to the invention will be apparent from the following description of embodiments thereof, given by way of non-limitative examples with reference to the accompanying drawings. In the drawings.

DETAILED DESCRIPTION OF THE PREFERRED EMBODIMENTS

The method of assembling modules for an integrated circuit, according to the invention, provides a plurality of module architectures. In particular, the architectures are aligned along a preferred dimension of the modules, and each architecture comprises a plurality of simple modules. It will be appreciated by the skilled person in the art that the problem to be solved by this invention concerns the optimum arrangement of modules on a two-dimensional plane, wherein the overall width and length of the circuit are referenced X and Y. With the two-dimensional plane shown in the figures taken as a reference, and to make the description consistent with such reference, what is normally the length Y of the module will be termed its "height" hereinafter. Based on the above assumption, the alignment of the modules along their length will be referred to as a "stacked arrangement", and the resulting architecture as a "stacked architecture", hereinafter.

Figure 3:
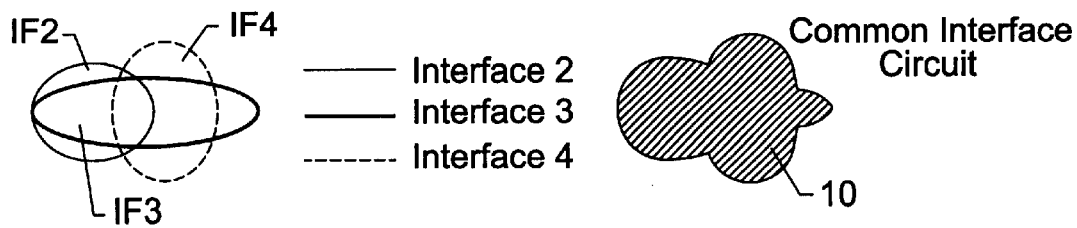
FIG. 3 shows schematically the principle of consolidating interface circuits for aligned module architectures according to the invention.
Figure 2:
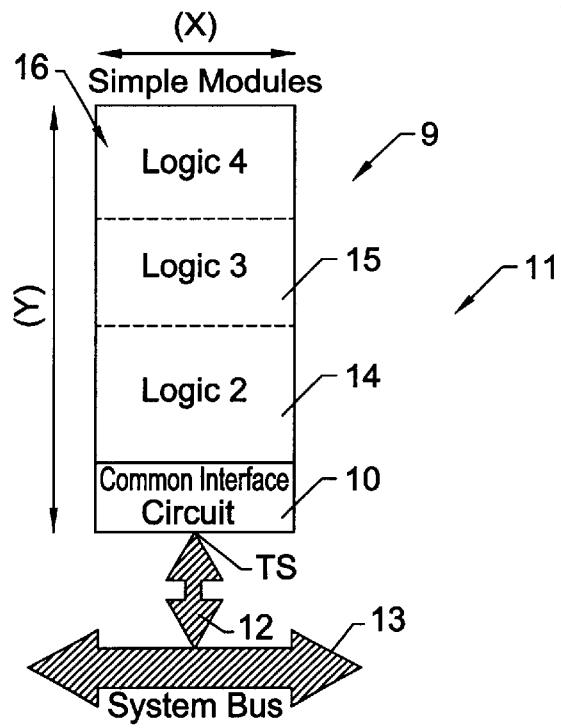
FIG. 2 shows schematically an aligned architecture of modules, specifically simple modules, according to this invention.

In particular, a stacked architecture of simple modules is generally shown schematically at 9 in FIG. 2. The stacked architecture 9 of this invention is advantageously assembled without introducing individual interface circuits. A common interface circuit 10 is provided instead, which combines all the characteristics of the individual interface circuits provided in the prior art for the individual simple modules. The consolidating principle of such interface circuits is illustrated schematically in FIG. 3. A stacked architecture 11 thus formed has a height Y which is preset originally at the designing stage of the integrated circuit.

Advantageously in this invention, the common interface circuit 10 involves only a trivial increase in the silicon area occupied. This is so especially when compared to the overall saving in silicon area brought about by the use of stacked module architectures, and which saving is to be ascribed to the presence of a single interface circuit.

Either of two assembling procedures, according to whether a so-called semi-custom or full-custom design is involved, can be adopted. With a semi-custom design, automatic layout tools are used. In this case, once the common interface circuit 10 is defined, a stacked architecture 11 can be created automatically which has a layout height Y and includes the logics of a number of simple modules, and the common interface circuit 10. In particular, the stacked architecture 11 has system terminals TS provided at the bottom of the architecture for convenient connection to a system bus 13 via a bus 12.

With a full-custom design, the layouts of the modules and the final integrated circuit are instead defined manually. In this case, it is necessary to abide by certain designing rules, for best utilization of the inventive assembling method, as specified below.

1. The layout of each simple module should have the same width x.

2. The data transfer logic, commonly referred to as the data path, should be separated, even physically, from the random logic. In particular, the width of such logics should be the same in each simple module, for greater ease of "stacking" the modules. This design stage can be simplified by the use of a layout library, easily selected from those available commercially.

3. The layout of each simple module should contain all the signals generated by the common interface circuit 10, and fully or partly utilized by the module for supplying the other modules included in the same stacked architecture 11.

In the light of the foregoing, it is necessary for the system terminals TAi, TBi, arranged to transfer the signals generated by the common interface circuit 10, to be located at the same coordinates in the upper and lower portions of the layout of each simple module in the stacked architecture 11 and of the layout of the common interface circuit 10.

Figure 4:
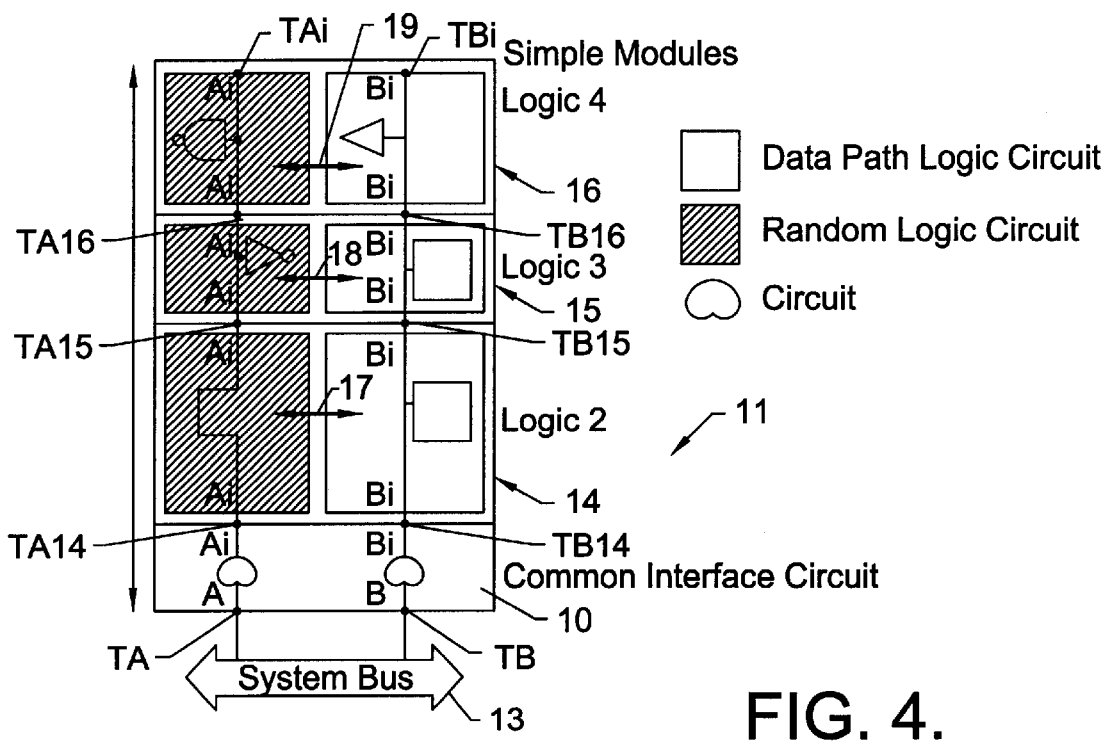
FIG. 4 shows the aligned module architecture of FIG. 3 in greater detail.

FIG. 4 shows in greater detail the stacked architecture 11 of FIG. 2 as produced in compliance with the above rules. The stacked architecture 11 comprises first 14, second 15 and third 16 modules (in particular simple modules), and the common interface circuit 10 connected to the system bus 13. In particular, the separation of the Random logic circuits Ai from the Data Path logic circuits Bi is brought out. These are interconnected by internal buses 17, 18 and 19 at each of the modules 14, 15 and 16 (horizontal connection) and have corresponding system terminals TA14, TA15, TA16 and TB14, TB15, TB16, for connection to the common interface circuit 10 (vertical connection), generated by the same from two final system terminals TA and TB of the system bus 13. Advantageously in this invention, the Random Ai and Data Path Bi logic circuits of the various modules 14, 15, 16 have corresponding widths for an architecture 11 rightly stacked.

Figure 1:
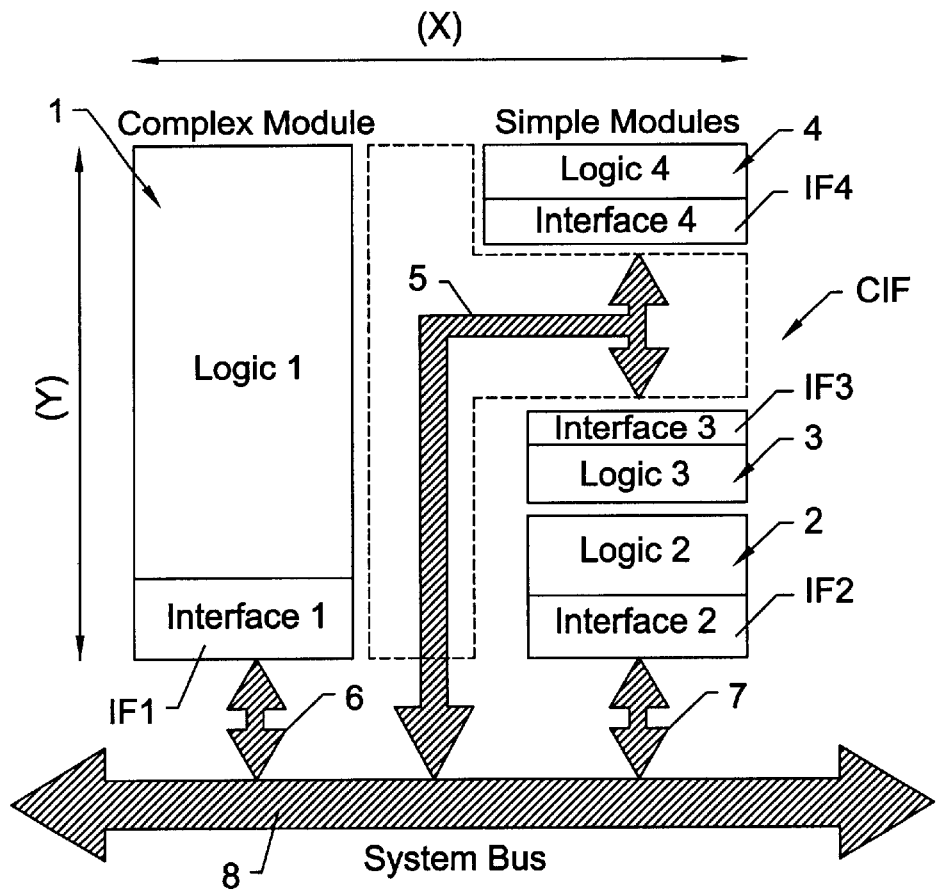
FIG. 1 shows schematically an integrated circuit portion as obtained by an assembling method according to the prior art.
Figure 5:
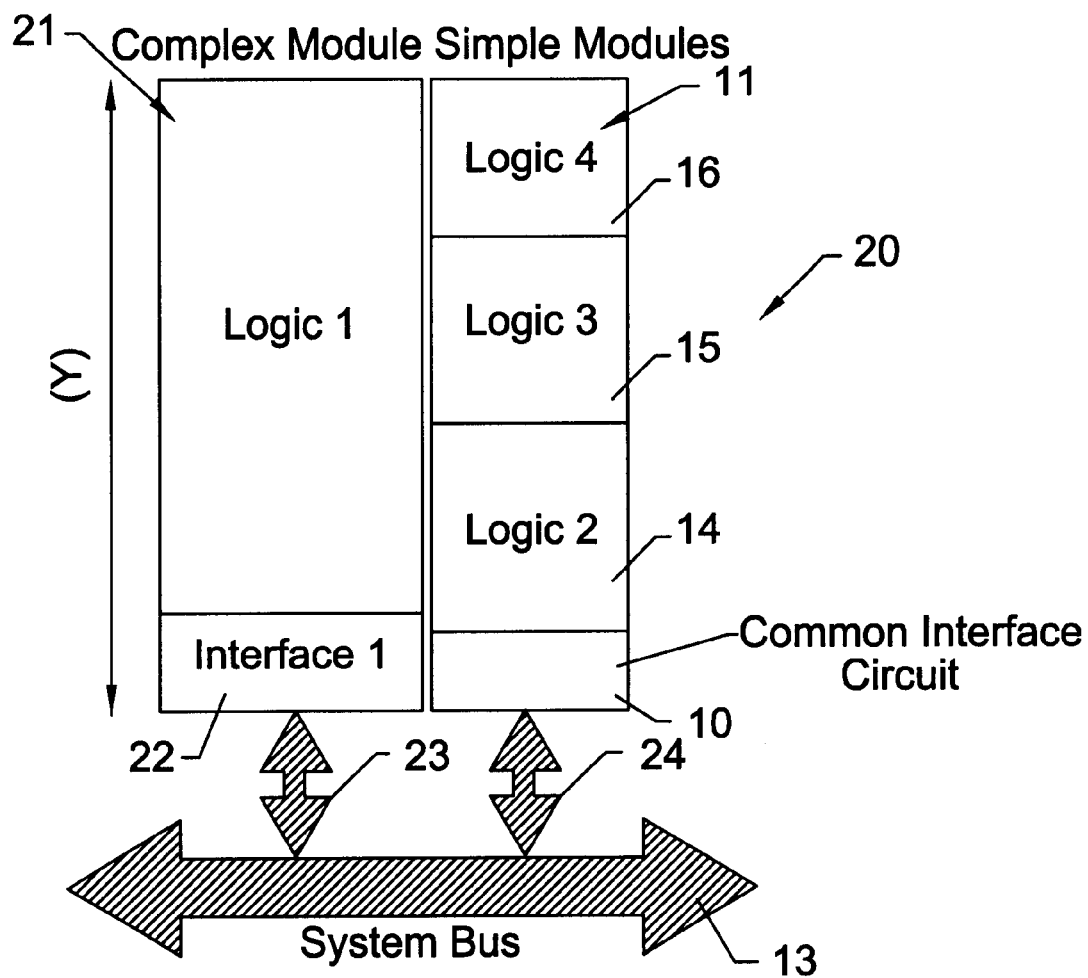
FIG. 5 shows schematically an integrated circuit as obtained by the assembling method of the invention.

Lastly, FIG. 5 shows schematically a final integrated circuit, generally indicated at 20, which comprises a complex module 21 provided with an interface circuit 22 and a stacked architecture 11 of simple modules, obtained by the method of this invention and having a common interface circuit 10. In particular, it should be noted that, connected to the system bus 13, are now only two bi-directional buses 23 and 24, respectively, for transferring signals between interface circuits 22 and 10 of the complex module 21 and the stacked architecture 11. In this way, a complicated bus pattern, such as the supplying path 5 to the modules 3 and 4 of the final integrated circuit CIF provided conventionally as shown schematically in FIG. 1, is no longer required.

To summarize, this method of assembling modules to form an integrated circuit has the following advantages:

1) the silicon area occupied by the final integrated circuit can be optimized by the use of a single interface circuit;
2) the silicon area occupied by the final integrated circuit can be optimized by the use of a system bus limited to a single direction; in particular, no complicated bus pattern for supplying the various simple modules in the final integrated circuit is required;
3) the capacitive load connected to the common system bus can be reduced, thereby improving the speed of the final integrated circuit as a whole; and
4) the assembling time for the individual modules or module architecture in the final integrated circuit can be shortened.

That which is claimed is:

1. A method of assembling functional modules to form a complex integrated circuit including a plurality of said functional modules arranged to have a predetermined height, wherein at least one of said functional modules has a predetermined width, the method comprising the step of:
providing a stacked architecture of simple modules within at least one of said functional modules having the predetermined width which are aligned along the height of said plurality of functional modules, and a common interface circuit interconnecting said stacked architecture of modules.

2. A method according to claim 1, further comprising the step of providing a connection to a system bus carrying system signals of the integrated circuit by means of system terminals arranged at the bottom of the architecture of simple modules.

3. A method according to claim 2, wherein each simple module includes separate internal logic circuits.

4. A method according to claim 3, further comprising the step of providing a connection of the internal logic circuits comprising a plurality of internal buses at each module included in the architecture of simple modules.

5. A method according to claim 1, further comprising the steps of:

processing all the signals generated by the common interface circuit within each simple module; and fully or partly utilizing the signals from each simple module to supply the other simple modules included in the architecture of simple modules.

6. A method according to claim 5, further comprising the step of transferring the signals generated by the common interface circuit by system terminals placed at corresponding coordinates in the upper and lower portions of each simple module included in the architecture of simple modules.

7. An integrated circuit comprising:

a plurality of functional modules arranged to have a predetermined height, and wherein one of said plurality of functional modules has a predetermined height and width and is constructed as an architecture of simple modules aligned along the height of said functional modules; and a common interface circuit interconnecting said simple modules contained in the at least one of said functional modules.

8. An integrated circuit according to claim 7, further comprising system terminals arranged at the bottom of the architecture of simple modules for connection to a system bus carrying system signals of the integrated circuit.

9. An integrated circuit according to claim 8, wherein each module included in the architecture of simple modules comprises first and second internal logic circuits physically separated from each other.

10. An integrated circuit according to claim 9, wherein said modules included in the architecture of modules have the same width.

11. An integrated circuit according to claim 10, wherein said first and second internal logic circuits have the same width.

12. An integrated circuit according to claim 9, wherein said first and second internal logic circuits are connected by a plurality of internal buses at each simple module included in the architecture of simple modules.

13. An integrated circuit according to claim 7, wherein each simple module included in the architecture of simple modules and the common interface circuit have system terminals located at corresponding coordinates in upper and lower portions of the simple modules and the common interface circuit for transferring the signals generated by the common interface circuit.

14. A module architecture comprising:

a plurality of functional modules, one of said functional modules having a predetermined height and width;

a plurality of simple modules aligned along one dimension within the functional module and forming an architecture of simple modules; and a common interface circuit interconnecting said simple modules.

15. A module architecture according to claim 14, further comprising system terminals arranged at a bottom of said architecture of simple modules for connection to a system bus carrying system signals of the integrated circuit.

16. A module architecture according to claim 15, wherein each simple module comprises first and second internal logic circuits physically separated from each other.

17. A module architecture according to claim 16, wherein the plurality of simple modules have the same width.

18. A module architecture according to claim 17, wherein said first and second internal logic circuits have the same width.

19. A module architecture according to claim 18, wherein each simple module and the common interface circuit have system terminals located at corresponding coordinates in upper and lower portions of the simple modules for transferring the signals generated by the common interface circuit within the architecture of simple modules.

20. A module architecture according to claim 16, wherein said first and second internal logic circuits are connected by a plurality of internal buses at each simple module.

* * * * *